United States Patent
Ni et al.

(10) Patent No.: US 12,261,012 B2
(45) Date of Patent: Mar. 25, 2025

(54) PLASMA TREATMENT APPARATUS, LOWER ELECTRODE ASSEMBLY AND FORMING METHOD THEREOF

(71) Applicant: ADVANCED MICRO-FABRICATION EQUIPMENT INC. CHINA, Shanghai (CN)

(72) Inventors: Tuqiang Ni, Shanghai (CN); Sheng Guo, Shanghai (CN); Xiang Sun, Shanghai (CN); Guangwei Fan, Shanghai (CN); Kuan Yang, Shanghai (CN); Hongqing Wang, Shanghai (CN); Xingjian Chen, Shanghai (CN); Ruoxin Du, Shanghai (CN)

(73) Assignee: ADVANCED MICRO-FABRICATION EQUIPMENT INC., Shanghai (CN)

( * ) Notice: Subject to any disclaimer, the term of this patent is extended or adjusted under 35 U.S.C. 154(b) by 224 days.

(21) Appl. No.: 17/680,225

(22) Filed: Feb. 24, 2022

(65) Prior Publication Data
US 2022/0351933 A1 Nov. 3, 2022

(30) Foreign Application Priority Data
Apr. 28, 2021 (CN) .......................... 202110466298.5

(51) Int. Cl.
*H01J 37/32* (2006.01)
*H01J 37/04* (2006.01)
*H01J 37/305* (2006.01)
*H01L 21/3065* (2006.01)

(52) U.S. Cl.
CPC .......... *H01J 37/04* (2013.01); *H01J 37/3053* (2013.01); *H01J 37/32091* (2013.01); *H01J 37/32642* (2013.01); *H01L 21/3065* (2013.01)

(58) Field of Classification Search
CPC .. H01J 37/04; H01J 37/3053; H01J 37/32091; H01J 37/32642; H01J 37/32715; H01J 37/32568; H01J 37/32798; H01J 2237/3343; H01J 37/32174; H01J 15/00; H01J 37/32082; H01J 37/3244; H01J 37/32623; H01J 37/32009; H01J 37/32532; H01L 21/3065; H01L 21/67069;
(Continued)

(56) References Cited

U.S. PATENT DOCUMENTS 6,039,836 A * 3/2000 Dhindsa ............ H01J 37/32642
204/298.31
6,475,336 B1 * 11/2002 Hubacek ............. C23C 16/4586
156/345.47
(Continued)

*Primary Examiner* — Rudy Zervigon
(74) *Attorney, Agent, or Firm* — Womble Bond Dickinson (US) LLP; Joseph Bach, Esq.

(57) ABSTRACT

Disclosed is a plasma treatment apparatus, a lower electrode assembly and a forming method thereof, wherein the lower electrode assembly includes: a base for carrying a substrate to be treated; a focus ring encircling a periphery of the base; a coupling loop disposed below the focus ring; a conductive layer disposed in the coupling loop; and a wire for electrically connecting the conductive layer and the base so that the base and the conducting layer are equipotential. The lower electrode assembly is less prone to cause arc discharge.

8 Claims, 5 Drawing Sheets

(58) Field of Classification Search
CPC . C23C 16/507; C23C 16/509; C23C 16/5096; C23C 16/45565
USPC .......... 118/728, 723 E, 723 ER; 156/345.51, 156/345.43, 345.44, 345.45, 345.46, 156/345.47
See application file for complete search history.

(56) References Cited

U.S. PATENT DOCUMENTS

| | | | | |
|---|---|---|---|---|
| 8,894,806 | B2* | 11/2014 | Koshimizu | H01J 37/32091 |
| | | | | 118/728 |
| 9,852,889 | B1* | 12/2017 | Kellogg | H01J 37/1471 |
| 10,557,190 | B2* | 2/2020 | Taga | C23C 4/08 |
| 2004/0261946 | A1* | 12/2004 | Endoh | H01J 37/32642 |
| | | | | 156/345.1 |
| 2010/0243606 | A1* | 9/2010 | Koshimizu | H01J 37/32174 |
| | | | | 156/345.44 |
| 2011/0021031 | A1* | 1/2011 | Taylor | H01J 37/32467 |
| | | | | 264/319 |
| 2020/0152428 | A1* | 5/2020 | Sasaki | H01J 37/32091 |
| 2022/0399193 | A1* | 12/2022 | Cui | H01J 37/32724 |

* cited by examiner

```
┌─────────────────────────────────────────────────────────┐
│ Providing a base for carrying a substrate to be treated │
│ and having a focus ring disposed on a periphery         │──S1
│ thereof, and a coupling loop being disposed below the   │
│ focus ring;                                             │
└─────────────────────────────────────────────────────────┘
                            │
                            ▼
┌─────────────────────────────────────────────────────────┐
│ Disposing a conductive layer in the coupling loop, and  │──S2
│ the conductive layer being electrically connected with  │
│ the base through a wire.                                │
└─────────────────────────────────────────────────────────┘
```

FIG. 4

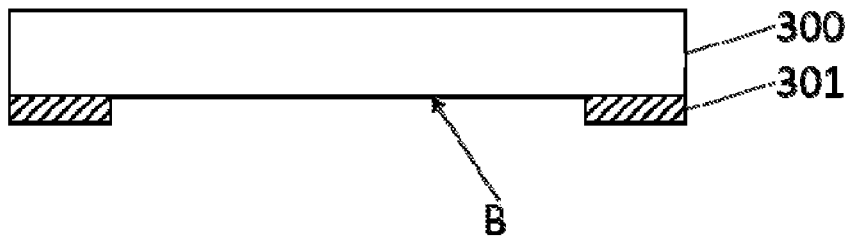

FIG. 5

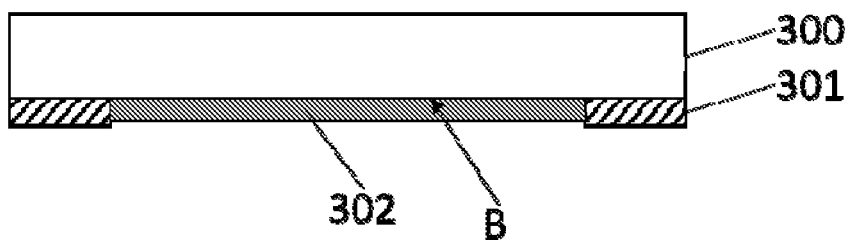

FIG. 6

PLASMA TREATMENT APPARATUS, LOWER ELECTRODE ASSEMBLY AND FORMING METHOD THEREOF

RELATED APPLICATIONS

The present application claims priority to and the benefit of Chinese Patent Application No. 202110466298.5, filed on Apr. 28, 2021, the disclosure of which is hereby incorporated by reference in its entirety.

FIELD OF TECHNOLOGY

The present invention relates to the field of semiconductors, in particular to a plasma treatment apparatus, a lower electrode assembly and a forming method thereof.

BACKGROUND

The plasma treatment apparatus includes: a vacuum reaction chamber; and a lower electrode assembly positioned at a base in the vacuum reaction chamber, and configured for carrying a substrate to be treated. The plasma treatment apparatus operates by passing a reaction gas containing an appropriate etchant source gas into a vacuum reaction chamber, which is then fed with radio frequency energy to activate the reaction gas to excite and maintain the plasma, and the plasma is used for treating the substrate to be treated.

With the increasing integration of semiconductor devices, the etching size is getting smaller and smaller, and the corresponding requirement of higher applied power will make the existing lower electrode assembly prone to cause arc discharge.

SUMMARY

The technical problem solved by the present invention is to provide a plasma treatment apparatus, a lower electrode assembly and a forming method thereof, so as to prevent arc discharge between a base and a coupling loop in the lower electrode assembly.

To solve the above technical problem, the present invention provides a lower electrode assembly including: a base for carrying a substrate to be treated; a focus ring encircling a periphery of the base; a coupling loop disposed below the focus ring; a conductive layer disposed in the coupling loop; and a wire for electrically connecting the conductive layer and the base so that the base and the conducting layer are equipotential.

Optionally, the base includes a platform portion and a step portion positioned at a periphery of the platform portion.

Optionally, the coupling loop comprises a first coupling portion opposite a side wall of the platform portion and a second coupling portion opposite a surface of the step portion.

Optionally, the conductive layer is disposed in at least one of the first coupling portion and the second coupling portion, and the conductive layer is wrapped by the first coupling portion or the second coupling portion.

Optionally, the conductive layer is made of a metal, a semiconductor material or carbon fiber.

Optionally, a material of the conductive layer is the same material as that of the coupling loop, and the conductive layer is internally provided with doped ions, and the doped ions have different ionic valence states from the material of the coupling loop.

Optionally, the doped ions are at least one of metal ions and inorganic ions; the metal ions comprise nickel ions or magnesium ions; and the inorganic ions comprise carbon ions, nitrogen ions or silicon ions.

Optionally, when the material of the conductive layer is the carbon fiber, the conductive layer is sandwiched in the coupling loop, and the coupling loop exposes an end of the conductive layer.

Optionally, a distance from a top surface of the conductive layer to a top surface of the coupling loop is greater than 100 microns and less than a thickness of the coupling loop.

Accordingly, the present invention further provides a plasma treatment apparatus, including: a reaction chamber; and the said lower electrode assembly positioned in the reaction chamber.

Optionally, the plasma treatment apparatus is a capacitively coupled plasma treatment apparatus and further includes: a mounting base positioned at a top of the reaction chamber; a gas shower head positioned below the mounting base and disposed opposite to the lower electrode assembly; a source power electrically connected with the gas shower head or the base; and a bias source power electrically connected with the base.

Optionally, the plasma treatment apparatus is an inductively coupled plasma treatment apparatus and further includes: an insulation window positioned at a top of the reaction chamber; an inductance coil positioned above the insulation window; a source power electrically connected with the inductance coil; and a bias source power electrically connected with the base.

Optionally, a power range of the source power is greater than 4,000 watts; and a power of the bias source power is greater than 30,000 watts.

Accordingly, the present invention further provides a forming method of a lower electrode assembly, including: providing a base for carrying a substrate to be treated and having a focus ring disposed on a periphery thereof, and a coupling loop being disposed below the focus ring; and disposing a conductive layer in the coupling loop, and the conductive layer being electrically connected with the base through a wire so that the base and the conducting layer are equipotential.

Optionally, a forming method of the conductive layer and the coupling loop includes: providing a first coupling member comprising a surface to be treated; disposing a mask layer on a periphery of the surface to be treated; forming a conductive layer on the surface to be treated by using the mask layer as a mask; removing the mask layer after forming the conductive layer; forming a second coupling member on the periphery of the surface to be treated and a surface of the conductive layer after removing the mask layer; and the second coupling member and the first coupling member constitute the coupling loop.

Optionally, a forming process of the conductive layer is an electrochemical process, the electrochemical process includes brushing silver paste on the surface to be treated and baking to form a silver layer; and electroplating, using the silver layer as an electrode, to form the conductive layer.

Optionally, the forming process of the conductive layer is a sputtering process.

Optionally, the forming process of the conductive layer is a sputtering process, and the ion implantation process implants doped ions that are different from ions of the coupling loop material.

Optionally, the conductive layer is made of carbon fiber; a forming method of the conductive layer and the coupling loop includes: providing a first coupling member comprising a surface to be treated; forming the conductive layer on the surface to be treated; and forming a second coupling member on a surface of the conductive layer.

Compared with the prior art, the technical solution of the embodiments of the present invention has the beneficial effects that:

in the plasma treatment apparatus provided by the technical solution of the present invention, in order to allow thermal expansion and contraction between the coupling loop and the base, a gap is provided between the coupling loop and the base. Despite the gap between the coupling loop and the base, the coupling loop is provided with a conductive layer inside, and the conductive layer is electrically connected with the base through a wire so that a potential of the base is equal to that of the conductive layer, then a potential difference between the base and the coupling loop is transferred to a potential difference between the conductive layer and the coupling loop above the conductive layer. Since there is no gap in the coupling loop above the conductive layer and the breakdown resistance is good, the discharge is less likely to occur between the conductive layer and the coupling loop above the conductive layer. Although there is a gap between the coupling loop under the conductive layer and the base, the arc discharge is less likely to occur between the coupling loop and the base because of the equipotential between the coupling loop and the base.

BRIEF DESCRIPTION OF THE DRAWINGS

FIG. 4 is a process flow chart of a lower electrode assembly forming method of the present invention;

FIG. 5 to FIG. 7 are structural diagrams of respective steps of forming the lower electrode assembly of the present invention;

DETAILED DESCRIPTION OF THE EMBODIMENTS

As described in the Background, the arc discharge easily occurs between the coupling loop and the base, in order to solve the technical problem, the technical solution of the present invention provides a plasma treatment apparatus, a lower electrode assembly and a forming method thereof. The plasma treatment apparatus can reduce probability of arc discharge between the coupling loop and the base.

Hereinafter, the embodiments of the present invention will be described in detail in combination with the accompanying drawings so as to make the above objects, features and beneficial effects of the present invention more apparent.

Figure 1:
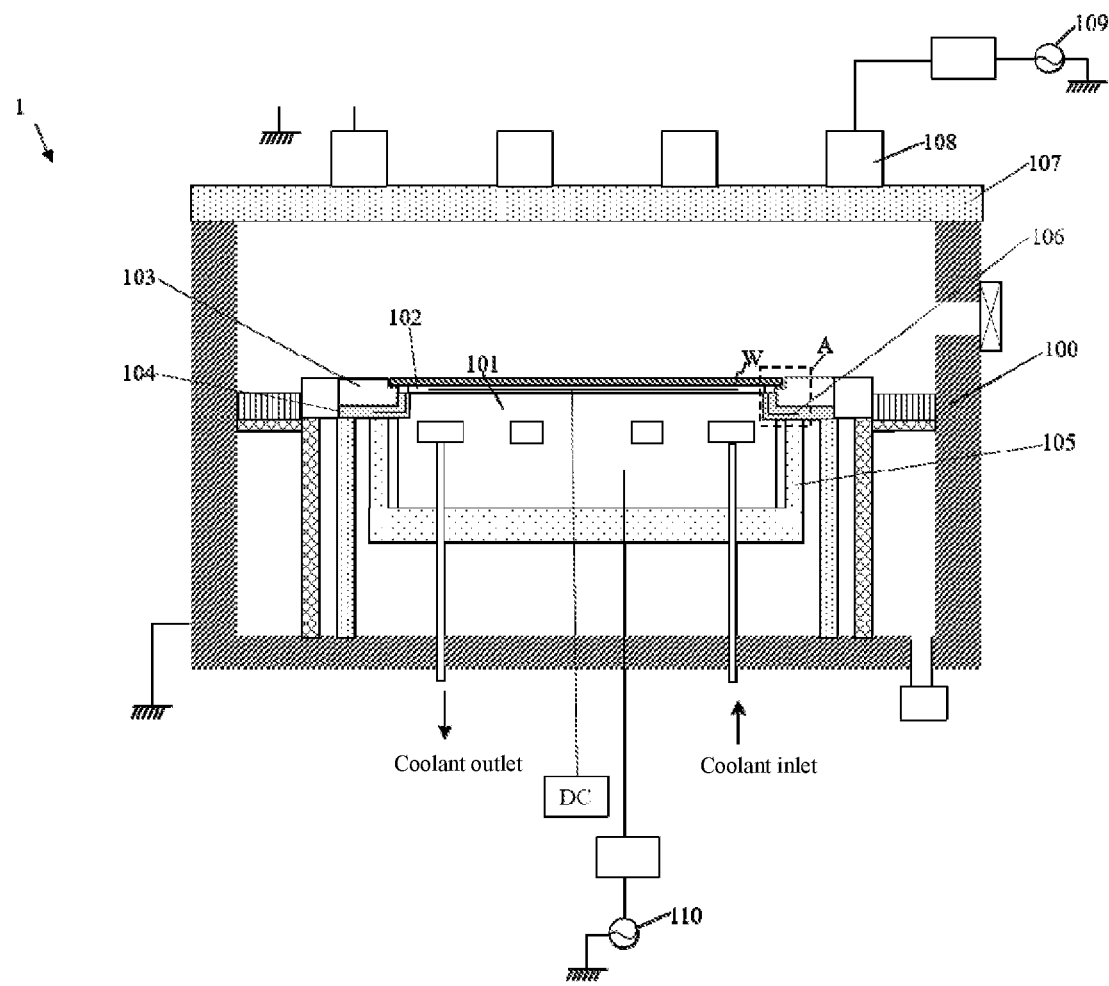
FIG. 1 is a structural diagram of a plasma treatment apparatus of the present invention.

FIG. 1 is a structural diagram of a plasma treatment apparatus of the present invention.

Referring to FIG. 1, the plasma treatment apparatus 1 includes: a reaction chamber 100; a base 101 positioned in the reaction chamber 100; an electrostatic chuck 102 positioned above the base 101 for absorbing a substrate W to be treated; an insulation window 107 positioned at a top of the reaction chamber 100; and an inductance coil 108 positioned above the insulation window 107.

In this embodiment, the plasma treatment apparatus 1 is an inductively coupled plasma (ICP) reaction device, and the plasma treatment apparatus 1 further includes: a source power 109 that applies a radio frequency voltage to the inductance coil 108 through a radio frequency matching network; and a bias source power 110 that is electrically connected to the base 101. A gas injection port (not shown) is provided at one end of a side wall of the reaction chamber 100 near the insulation window 107, in other embodiments, the gas injection port may also be disposed in a central region of the insulation window 107, and the gas injection port is used for injecting the reactive gas into the reaction chamber 100. Radio frequency power of the radio frequency source 109 drives the inductance coil 108 to generate a strong high-frequency alternating magnetic field, causing the low-pressure reaction gas in the reaction chamber 100 to be ionized to produce plasma. Plasma contains a large number of active particles such as electrons, ions, excited atoms, molecules and free radicals, which can react with a surface of the substrate W to be treated in a variety of physical and chemical reactions, so that the surface morphology of the substrate W to be treated is changed, that is, an etching process is completed. The bias radio frequency source 110 applies a bias radio frequency voltage to the base through a radio frequency matching network for controlling a bombardment direction of charged particles in the plasma.

In addition, the plasma treatment apparatus 1 further includes a facility plate 105 surrounds the base 101, the facility plate 105 includes a bottom plate and an extension plate extending upwardly from both ends of the bottom plate, the bottom plate is positioned below the base 101, and the extension plate is positioned below the coupling loop 104. The extension plate is provided with a temperature control channel for controlling a temperature of the focus ring 103.

Figure 2:
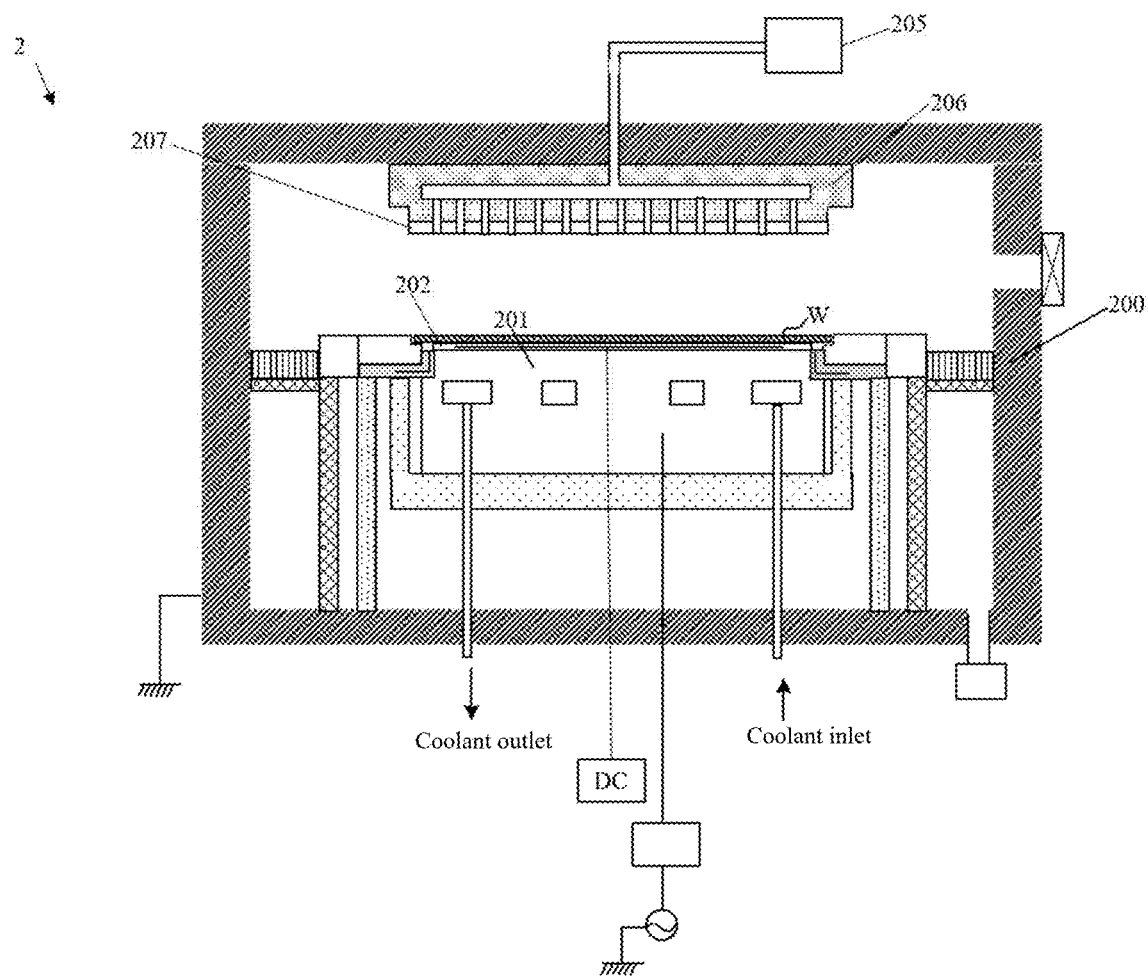
FIG. 2 is a structural diagram of another plasma treatment apparatus of the present invention.

FIG. 2 is a structural diagram of another plasma treatment apparatus of the present invention.

Referring to FIG. 2, the plasma treatment apparatus 2 includes: a reaction chamber 200; a base 201 positioned at a bottom of the reaction chamber 200; an electrostatic chuck 202 positioned above the base 201 for absorbing a substrate W to be treated; a mounting base 206 positioned at a top of the reaction chamber 200; a gas shower head 207 positioned below the mounting base 206 and disposed opposite to the base 201; and a gas source 205 communicating with the gas shower head 207 and configured for conveying a reaction gas into the reaction chamber 200.

In this embodiment, the plasma treatment apparatus 2 is a capacitively coupled plasma (CCP) treatment apparatus, in which the gas shower head 207 serves as an upper electrode and the base 201 serves as a lower electrode, and a reaction region is formed between the upper electrode and the lower electrode. In addition, the plasma treatment apparatus 2 further includes a source power electrically connected with the gas shower head 207 or the base 201; and a bias source power electrically connected to the base 201. Herein, the radio frequency source and the bias radio frequency source are connected to the base 201 as an example.

The source power is applied to one of the upper electrode and the lower electrode through a matching network, to generate a radio frequency electric field between the upper electrode and the lower electrode, for dissociating the reaction gas into a plasma. Plasma contains a large number of active particles such as electrons, ions, excited atoms, molecules and free radicals, which can react with a surface of the substrate W to be treated in a variety of physical and chemical reactions, so that the surface morphology of the substrate W to be treated is changed, that is, an etching process is completed. An exhaust pump (not shown in the figure) is also disposed below the vacuum reaction chamber 100, for discharging the reaction by-products from the reaction chamber 100, to maintain the vacuum environment of the reaction chamber 100.

The density distribution of the plasma in the plasma treatment apparatus is proportional to the etching rate of the substrate W to be treated. The higher the density of the plasma, the higher the etching rate, and the lower the density of the plasma, the lower the etching rate. Due to the action of plasma flow, the plasma density in the central region of the substrate to be treated decreases and the plasma density in the edge part of the substrate to be treated increases, which leads to the decrease of the etching rate in the central region and the increase of the etching rate in the edge part of the surface of the substrate to be treated, resulting in the uneven etching rate of the substrate to be treated.

To solve the above problems, schematically illustrated in FIG. 1, a focus ring 103 is disposed on a periphery of the substrate W to be treated, which is equivalent to expanding a radius of the substrate W to be treated outward so that the plasma is generated above the focus ring 103 under the same conditions as above the substrate W to be treated, which effectively extends the plasma distribution edge above the substrate W to be treated to the outer side wall of the focus ring 103, enlarges the plasma distribution range, and widens the plasma density distribution curve on the surface of the substrate W, so that the plasma density distribution on the substrate W tends to be gentle, thus the plasma density distribution on the substrate W is more uniform, which is beneficial to ensure the uniformity of the etching process in the edge region and the central region.

The coupling loop 104 is disposed between the focus ring 103 and the base 101 to fill the gap between the focus ring 103 and the base 101 and prevent arc discharge between the focus ring 103 and the base 101.

In addition, with the continuous improvement of the integration level of semiconductor devices, the etching size of semiconductor devices is getting smaller and smaller, which requires higher power of the radio frequency source and the bias power source. The applied power of the radio frequency source and the power of the bias power source are higher, in particular, a power range of the radio frequency source is greater than 4,000 watts. The power of the bias radio frequency source is greater than 30,000 watts such that the arc discharge is prone to occur between the base 101 and the coupling loop 104. The present invention reduces the occurrence of the arc discharge between the coupling loop 104 and the base 101 by providing a conductive layer 106 within the coupling loop 104, and the conductive layer 106 is electrically connected to the base 101, as described in detail below.

Figure 3:
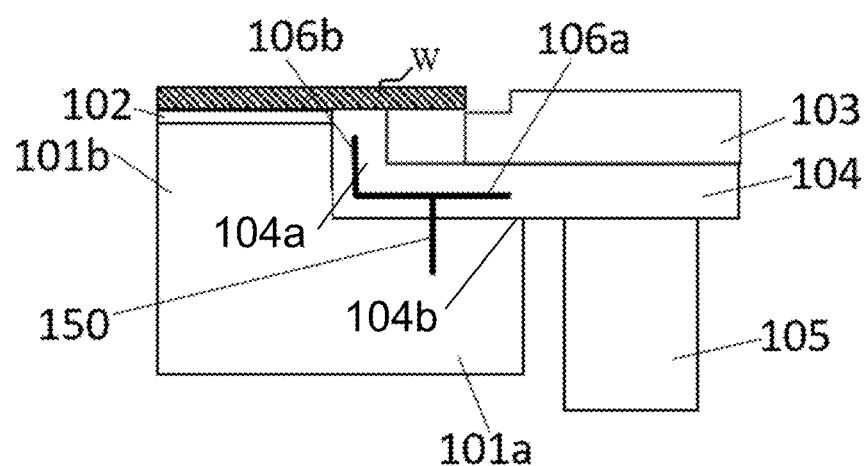
FIG. 3 is an enlarged partial view of region A in FIG. 1.

FIG. 3 is an enlarged partial view of region A in FIG. 1.

Referring to FIGS. 1 and 3, the base 101 (see FIG. 1) includes a platform portion 101b and a step portion 101a (see FIG. 3) positioned on a periphery of the platform portion 101b (see FIG. 3), and the coupling loop 104 includes a first coupling portion and a second coupling portion, the first coupling portion is opposite a side wall of the platform portion 101b, and the second coupling portion is opposite a surface of the step portion 101a.

The base 101 is made of an aluminum alloy, and the coupling loop 104 is made of a dielectric material, for example: ceramic or quartz, specifically as: aluminum oxide or yttrium oxide. On the one hand, in order to allow thermal expansion and contraction of the coupling loop 104 and the base 101, there is a gap between the coupling loop 104 and the base 101. On the other hand, the coupling loop 104 and the base 101 are hardly closely fitted so that there is a gap between the coupling loop 104 and the base 101.

In addition, the potential of the base 101 is different from that of the coupling loop 104. Although the potential between the base 101 and the coupling loop 104 is different, however, if a conductive layer 106 (see FIG. 1) is provided in the coupling loop 104, and the conductive layer 106 is electrically connected to the base 101 through a wire 150 so that the potential of the conductive layer 106 is equal to that of the base 101, the potential difference between the base 101 and the coupling loop 104 is transferred to the potential difference between the conductive layer 106 and the top of the coupling loop 104 above the conductive layer 106. Since the conductive layer 106 is positioned in the coupling loop 104, although there is a potential difference between the conductive layer 106 and the top of the coupling loop 104, there is no gap in the coupling loop 104 above the conductive layer 106 and the breakdown resistance is good, so the arc discharge less likely occurs between the conductive layer 106 and the coupling loop 104. Moreover, although there is a gap between the base 101 and the conductive layer 106, the potential difference between the base 101 and the conductive layer 106 is equal, the arc discharge also less likely occurs between the base 101 and the conductive layer 106.

In the present embodiment, the base 101 (see FIG. 1) includes a platform portion 101b and a step portion 101a (see FIG. 3) positioned on a periphery of the platform portion 101b (see FIG. 3), and the coupling loop 104 includes a first coupling portion 104a and a second coupling portion 104b, the first coupling portion 104a is opposite a side wall of the platform portion 101b, and the second coupling portion 104b is opposite a surface of the step portion 101a. The first coupling portion is provided with a first conductive layer 106b inside, the second coupling portion is provided with a second conductive layer 106a, the conductive layer 106 includes the first conductive layer 106b and the second conductive layer 106a. Ends of the first conductive layer 106b and the second conductive layer 106a may be connected or separated from each other.

In other embodiments, a first conductive layer is provided only in the first coupling portion, or a second conductive layer is provided only in the second coupling portion.

In other embodiments, the base is a plate structure, the base does not have steps, the coupling loop is positioned below the focus ring, and the coupling loop is provided with the conductive layer inside.

In one embodiment, the conductive layer 106 is made of metal, such as: copper or nickel. The advantage of using a metal as the conductive layer 106 includes: since the conductive layer 106 and subsequent conductors are both metallic, it is easier to weld both.

In another embodiment, the conductive layer 106 is made of carbon fiber, semiconductor material or graphite layer.

In yet another embodiment, the conductive layer is made of the same as that of the coupling loop, but the valence state of doped ions in the conductive layer is different from that of ions in the coupling loop material, the doped ions include at least one of metal ions and inorganic ions, the metal ions include nickel ions or magnesium ions; and the inorganic ions include carbon ions, nitrogen ions or silicon ions. Because the ionic valence state of the doped ion is different from that of the coupling loop material, the doped ion makes the coupling loop position where the doped ion is positioned have better conductivity and can be used as the conductive layer.

The distance between the top surface of the conductive layer 106 and the top surface of the coupling loop 104 is greater than 100 microns, which is less than the thickness of the coupling loop 104, so that the conductive layer 106 can not only be wrapped by the coupling loop 104, but also the thickness of the coupling loop 104 covered above the conductive layer 106 is not too thin, thus ensuring that the upper portion of the coupling loop 104 is not easy to be broken down.

The forming method of the lower electrode assembly will be described in detail below.

FIG. 4 is a process flow chart of a lower electrode assembly forming method of the present invention.

Please refer to FIG. 4, at step S1: a base is provided for carrying a substrate to be treated, a focus ring is disposed on a periphery of the base, and a coupling loop is disposed below the focus ring; step S2: a conductive layer is disposed in the coupling loop, and the conductive layer is electrically connected to the base through a wire.

How the conductive layer is formed is described in detail as follows.

Figure 7:
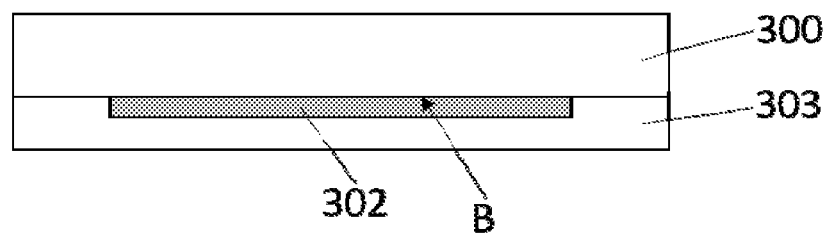

FIG. 5 to FIG. 7 are structural diagrams of respective steps of forming the lower electrode assembly of the present invention.

Referring to FIG. 5, provided is a first coupling member 300, the first coupling member 300 includes a surface B to be treated; and a mask layer 301 is provided on the periphery of the surface B to be treated.

The first coupling member 300 is made of a dielectric material, for example, a ceramic or quartz, as specified in: aluminum oxide or yttrium oxide. The first coupling member 300 and the second coupling member constitute the coupling loop.

The mask layer 301 is provided with a mask opening, which exposes the central region of the surface B to be treated, and the mask opening is used to define the position of the subsequent conductive layer. The mask layer 301 is positioned on the periphery of the surface B to be treated, so that the conductive layer formed subsequently does not cover the periphery of the first coupling member 300 but is positioned in the central region, so that the conductive layer can be completely surrounded without being exposed, which helps to prevent metal contamination.

Please refer to FIG. 6, the conductive layer 302 is formed by using the mask layer 301 as a mask.

In one embodiment, a forming process of the conductive layer 302 is an electrochemical process, the electrochemical process includes brushing silver paste on the surface to be treated and baking to form a silver layer; and electroplating, using the silver layer as an electrode, to form the conductive layer.

In another embodiment, the forming process of the conductive layer 302 is a sputtering process, and the conductive layer 302 is formed in the central region of the surface B to be treated by the sputtering process.

Referring to FIG. 7, after the conductive layer 302 is formed, the mask layer 301 is removed. After removing the mask layer 301, a second coupling member 303 is formed on the periphery of the surface B to be treated and the surface of the conductive layer 302, and the second coupling member 303 surrounds the conductive layer 302.

The mask layer 301 is removed and exposed to a peripheral region of the surface B to be treated and the side wall of the conductive layer 302, and the conductive layer 302 is surrounded by the second coupling member 303 formed subsequently, so that the conductive layer 302 is completely surrounded by the first coupling member 300 and the second coupling member 303, which helps to prevent metal contamination.

Figure 8:
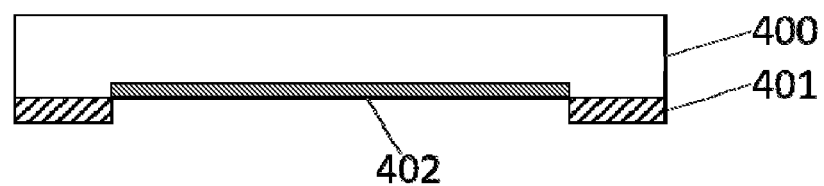
FIG. 8 is a structural diagram of another step of forming the lower electrode assembly of the present invention.

FIG. 8 is a structural diagram of another step of forming the lower electrode assembly of the present invention.

As in the above-described embodiments, the first coupling member 400 is provided, and the first coupling member 400 includes a surface to be treated. A mask layer 401 is formed on a periphery of the surface to be treated.

Referring to FIG. 8, by using the mask layer 401 as a mask, a conductive layer 402 is formed in part of the first coupling member 400 by adopting an ion implantation process.

Using the mask layer 401 as a mask, the doped ions are implanted into the first coupling member 400. The doped ions include at least one of metal ions and inorganic ions, the metal ions include nickel ions or magnesium ions; and the inorganic ions include carbon ions, nitrogen ions or silicon ions.

The implantation depth can be adjusted by controlling the energy of the implanted doped ions, thereby determining the thickness of the formed conductive layer 402. The advantage of forming the conductive layer 402 by the ion implantation process is that there is no interface between the conductive layer 402 formed by the ion implantation process and the first coupling member 400, and no delamination will occur.

After forming the conductive layer 402, the method further includes: removing the mask layer 401; and forming a second coupling member in a peripheral region of the conductive layer 402 and the first coupling member 400 after the mask layer 401 is removed, the second coupling member surrounding the conductive layer 402. The second coupling member surrounds the conductive layer 402 so that the conductive layer 402 is completely surrounded by the first coupling member 400 and the second coupling member, which helps to prevent metal contamination.

Figure 9:
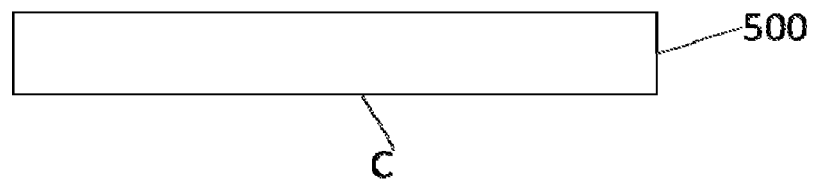
FIG. 9 to FIG. 11 are structural diagrams of another respective steps of forming the lower electrode assembly of the present invention.
Figure 10:
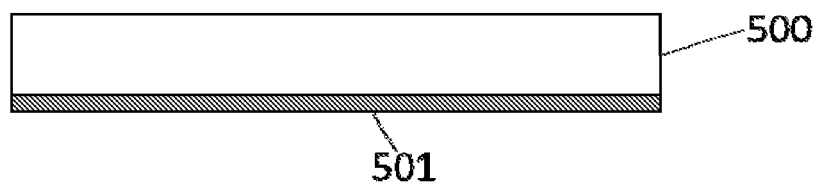
Figure 11:
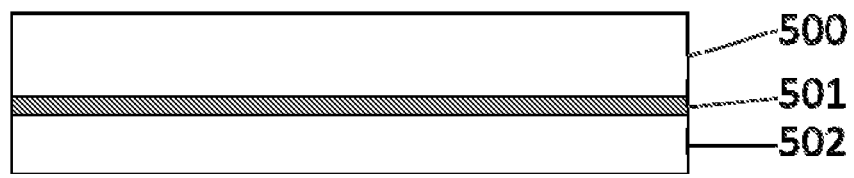

FIG. 9 to FIG. 11 are structural diagrams of another respective steps of forming the lower electrode assembly of the present invention.

Referring to FIG. 9, provided is a first coupling member 500, and the first coupling member 500 includes a surface C to be treated.

Referring to FIG. 10, a conductive layer 501 is formed on the surface C to be treated.

In this embodiment, the conductive layer 501 is made of carbon fiber, as carbon fiber exposure to the plasma environment does not bring metal contamination, so there is no need to additionally resort to a mask layer to make the subsequent second coupling member to surround the conductive layer 501, therefore, it is conducive to simplify the process steps and reduce process costs.

Referring to FIG. 11, a second coupling member 502 is formed on a surface of the conductive layer 501.

To sum up, a conductive layer is disposed in the coupling loop, and the conductive layer is electrically connected with the base through a wire, so that the potential of the base is equal to that of the conductive layer, and then the potential difference between the base and the coupling loop is transferred to the potential difference between the conductive layer and the coupling loop above the conductive layer. Since there is no gap in the coupling loop above the conductive layer and the breakdown resistance is better, no discharge will occur between the conductive layer and the coupling loop above the conductive layer, and the arc discharge is less likely to occur between the coupling loop and the base because of the equipotential between the coupling loop and the base.

Although the present invention is disclosed as above, the present invention is not limited thereto. Any person skilled in the art can make various changes and modifications without departing from the spirit and scope of the present invention, so the protection scope of the present invention is subject to the protection scope in claims.

The invention claimed is:

1. A lower electrode assembly, comprising:
a base for carrying a substrate to be treated wherein the base comprises a platform portion and a step portion positioned at a periphery of the platform portion;
a focus ring encircling a periphery of the base;
a coupling loop disposed below the focus ring;
a conductive layer disposed in the coupling loop;
a wire for electrically connecting the conductive layer and the base so that the base and the conductive layer are equipotential; and
wherein the coupling loop comprises a first coupling portion opposite a side wall of the platform portion and a second coupling portion opposite a surface of the step portion.

2. The lower electrode assembly according to claim 1, wherein the conductive layer is disposed in at least one of the first coupling portion and the second coupling portion, and the conductive layer is wrapped by the first coupling portion or the second coupling portion.

3. The lower electrode assembly according to claim 2, wherein the conductive layer is made of a metal, a semiconductor material or carbon fiber.

4. The lower electrode assembly according to claim 2, wherein a material of the conductive layer is the same material as that of the coupling loop, and the conductive layer is internally provided with doped ions, and the doped ions have different ionic valence states from the material of the coupling loop.

5. The lower electrode assembly according to claim 4, wherein the doped ions are at least one of metal ions and inorganic ions; the metal ions comprise nickel ions or magnesium ions; and the inorganic ions comprise carbon ions, nitrogen ions or silicon ions.

6. A lower electrode assembly, comprising:
a base for carrying a substrate to be treated;
a focus ring encircling a periphery of the base;
a coupling loop disposed below the focus ring;
a conductive layer disposed in the coupling loop; and
a wire for electrically connecting the conductive layer and the base so that the base and the conductive layer are equipotential;
wherein when the material of the conductive layer is carbon fiber, the conductive layer is sandwiched in the coupling loop, and the coupling loop exposes an end of the conductive layer.

7. A lower electrode assembly, comprising:
a base for carrying a substrate to be treated;
a focus ring encircling a periphery of the base;
a coupling loop disposed below the focus ring;
a conductive layer disposed in the coupling loop; and
a wire for electrically connecting the conductive layer and the base so that the base and the conductive layer are equipotential;
wherein a distance from a top surface of the conductive layer to a top surface of the coupling loop is greater than 100 microns and less than a thickness of the coupling loop.

8. A plasma treatment apparatus, comprising:
a reaction chamber;
a lower electrode assembly positioned in the reaction chamber and comprising:
a base for carrying a substrate to be treated;
a focus ring encircling a periphery of the base;
a coupling loop disposed below the focus ring;
a conductive layer disposed in the coupling loop; and
a wire for electrically connecting the conductive layer and the base so that the base and the conductive layer are equipotential;
wherein the plasma treatment apparatus is a capacitively coupled plasma treatment apparatus and further comprises: a mounting base positioned at a top of the reaction chamber; a gas shower head positioned below the mounting base and disposed opposite to the lower electrode assembly; a source power electrically connected with the gas shower head or a base; and a bias power electrically connected with the base; the power range of the source power is greater than 4,000 watts; and the power of the bias source power is greater than 30,000 watts.

* * * * *